United States Patent
Shi et al.

(10) Patent No.: US 8,999,193 B2
(45) Date of Patent: Apr. 7, 2015

(54) CHEMICAL MECHANICAL POLISHING COMPOSITION HAVING CHEMICAL ADDITIVES AND METHODS FOR USING SAME

(71) Applicant: Air Products and Chemicals, Inc., Allentown, PA (US)

(72) Inventors: Xiaobo Shi, Chandler, AZ (US); James Allen Schlueter, Phoenix, AZ (US); Maitland Gary Graham, Phoenix, AZ (US); Savka I. Stoeva, Chandler, AZ (US); James Matthew Henry, Mesa, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 0 days.

(21) Appl. No.: 13/832,234

(22) Filed: Mar. 15, 2013

(65) Prior Publication Data

US 2014/0099790 A1    Apr. 10, 2014

Related U.S. Application Data

(60) Provisional application No. 61/710,252, filed on Oct. 5, 2012, provisional application No. 61/645,222, filed on May 10, 2012.

(51) Int. Cl.
*H01L 21/306* (2006.01)
*C09G 1/02* (2006.01)
*H01L 21/3105* (2006.01)

(52) U.S. Cl.
CPC ............ *H01L 21/30625* (2013.01); *C09G 1/02* (2013.01); *H01L 21/31053* (2013.01)

(58) Field of Classification Search
None
See application file for complete search history.

(56) References Cited

U.S. PATENT DOCUMENTS

| | | | |
|---|---|---|---|
| 6,218,305 B1 | 4/2001 | Hosali et al. | |
| 6,447,563 B1 * | 9/2002 | Mahulikar | 51/309 |
| 6,527,622 B1 | 3/2003 | Brusic et al. | |
| 6,995,090 B2 | 2/2006 | Minamihaba et al. | |

(Continued)

FOREIGN PATENT DOCUMENTS

| | | |
|---|---|---|
| CN | 101906270 A | 12/2010 |
| JP | 2001035820 A | 2/2001 |

(Continued)

OTHER PUBLICATIONS

Shinn et al., "Chemical-Mechanical Polish," Handbook of Semiconductor Manufacturing Technology, Chapter 15, 2000, pp. 415-460.

*Primary Examiner* — Allan Olsen
(74) *Attorney, Agent, or Firm* — Lina Yang

(57) ABSTRACT

Chemical-mechanical polishing (CMP) compositions containing chemical additives and methods of using the CMP compositions are disclosed. The CMP composition comprises abrasive; chemical additive; liquid carrier; optionally an oxidizing agent; a pH buffering agent and salt; a surfactant and a biocide. The CMP compositions and the methods provide enhanced removing rate for "SiC", SiN" and "SiC$_x$N$_y$" films; and tunable removal selectivity for "SiC" in reference to SiO$_2$, "SiN" in reference to SiO$_2$, "SiC" in reference to "SiN", or "SiC$_x$N$_y$" in reference to SiO$_2$; wherein x ranges from 0.1 wt % to 55 wt %, y ranges from 0.1 wt % to 32 wt %.

12 Claims, 4 Drawing Sheets

(56) References Cited

U.S. PATENT DOCUMENTS

| | | | |
|---|---|---|---|
| 7,297,669 B2 * | 11/2007 | Martyak et al. | 510/175 |
| 7,678,700 B2 | 3/2010 | Desai et al. | |
| 8,043,970 B2 | 10/2011 | Lee et al. | |
| 8,247,328 B2 | 8/2012 | White et al. | |
| 2003/0181142 A1 * | 9/2003 | De Rege Thesauro et al. | 451/36 |
| 2004/0229552 A1 * | 11/2004 | Cherian et al. | 451/41 |
| 2005/0037936 A1 * | 2/2005 | Martyak et al. | 510/175 |
| 2005/0194563 A1 * | 9/2005 | Siddiqui et al. | 252/79.1 |
| 2006/0030158 A1 | 2/2006 | Carter et al. | |
| 2007/0209287 A1 | 9/2007 | Chen et al. | |
| 2007/0249167 A1 * | 10/2007 | Zhang et al. | 438/692 |
| 2007/0298612 A1 | 12/2007 | Dysard et al. | |
| 2008/0057713 A1 | 3/2008 | Desai et al. | |
| 2008/0060278 A1 | 3/2008 | White et al. | |
| 2008/0200033 A1 | 8/2008 | Takemiya | |
| 2009/0215268 A1 | 8/2009 | Everson et al. | |
| 2010/0009538 A1 | 1/2010 | Kamimura | |
| 2010/0144149 A1 | 6/2010 | Ward et al. | |
| 2010/0258528 A1 | 10/2010 | Singh et al. | |
| 2012/0003901 A1 | 1/2012 | Hu et al. | |
| 2014/0024216 A1 * | 1/2014 | Stender et al. | 438/692 |
| 2014/0273458 A1 * | 9/2014 | Shi et al. | 438/692 |

FOREIGN PATENT DOCUMENTS

| | | |
|---|---|---|
| JP | 2012040671 A2 | 3/2012 |
| TW | 326898 B | 7/2010 |
| TW | 201120165 A | 6/2011 |
| WO | 2010/065125 A1 | 6/2010 |
| WO | 2011049216 A1 | 4/2011 |

* cited by examiner

CHEMICAL MECHANICAL POLISHING COMPOSITION HAVING CHEMICAL ADDITIVES AND METHODS FOR USING SAME

CROSS-REFERENCE TO RELATED APPLICATIONS

This application claims the benefit of priority under 35 U.S.C. §119(e) to earlier filed U.S. patent applications with Ser. No. 61/645,222, filed on 10 May 2012; and Ser. No. 61/710, 252, filed on 5 Oct. 2012.

BACKGROUND OF THE INVENTION

This invention relates to chemical mechanical polishing compositions and methods of use the polishing compositions for polishing semiconductor substrates.

Chemical mechanical polishing (also referred to as chemical mechanical planarization, abbreviated as CMP) and chemical mechanical polishing compositions (also known as polishing slurries, polishing formulations, slurries, slurry compositions, or polishing compositions) for planarization of semiconductor substrates are now widely known to those skilled in the art.

An introductory reference on CMP is: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

A semiconductor substrate, such as a wafer, or an integrated circuit, usually has one or more layers of thin films comprising different materials deposited on its surface.

In a typical CMP process, a semiconductor substrate is placed in contact with a rotating polishing pad attached to a platen. A CMP composition, typically a chemical composition having abrasives, is supplied to the pad during CMP processing. The pad, the CMP composition, and the substrate, are moved relative to one another. Thus, the CMP process accomplishes the polishing (or planarization) by chemically and mechanically interacting with the substrate, that is, concurrent chemical and mechanical abrasion of the surface of the substrate. Polishing continues until the desired thickness of the film on the substrate is removed.

Development of the next generation of semiconductor devices has emphasized the use of materials having a greater hardness and other unique properties for high-power, high-temperature, and high-frequency operation applications.

Silicon Nitride is a high strength hard material that can have a number of uses, such as an electrical insulator, a chemical diffusion barrier, a dielectric in capacitors, or an etch stop mask. Silicon carbide is a material with unique combination of electrical and thermo-physical properties, such as high practical operating temperature, good corrosion resistance, and high thermal conductivity. However, $Si_3N_4$ and SiC are significantly harder and chemically inert than other materials comprising an integrated circuit.

CMP for polishing semiconductor $Si_3N_4$ and SiC substrates has been described further in patents, patent publications and literature publications.

U.S. Pat. No. 6,218,305 disclosed a method for polishing a composite comprised of silica and silicon nitride wherein a polishing composition is used comprising: an aqueous medium, abrasive particles, a surfactant, an organic polymer viscosity modifier which increases the viscosity of the composition, and a compound which complexes with the silica and silicon nitride wherein the complexing agent has two or more functional groups each having a dissociable proton, the functional groups being the same or different.

US 2008/0057713 or U.S. Pat. No. 7,678,700 taught a method of chemically-mechanically polishing a substrate comprising at least one layer of silicon carbide with a polishing composition comprising a liquid carrier, an abrasive, and an oxidizing agent.

US20100144149 disclosed a method for selectively removing silicon carbide from the surface of a substrate in preference to silicon dioxide. The method comprises abrading a surface of substrate with a polishing composition that comprises a particulate abrasive, at least one acidic buffering agent, and an aqueous carrier.

US 20100258528 taught slurry compositions and chemically activated CMP methods for polishing a substrate having a silicon carbide surface using such slurries. In such methods, the silicon carbide surface is contacted with a CMP slurry composition that comprises i) a liquid carrier; and ii) a plurality of particles having at least a soft surface portion, wherein the soft surface portion includes a transition metal compound that provides a Mohs hardness < or =6; and optionally iii) an oxidizing agent. The oxidizing agent can include a transition metal. The slurry is moved relative to the silicon carbide comprising surface, wherein at least a portion of the silicon carbide surface is removed.

US20120003901 disclosed a highly dilutable chemical mechanical polishing concentrate comprising an abrasive, an acid, a stabilizer, and water with a point-of-use pH ranging from 2.2-3.5 for planarizing current and next generation semiconductor integrated circuit FEOL/BEOL substrates.

U.S. Pat. No. 8,043,970 disclosed high selectivity of polishing silicon nitride with respect to silicon oxide. The slurry compositions included an agent for reducing the oxide polishing rate.

U.S. Pat. No. 6,995,090 disclosed a polishing slurry for CMP of SiC series compound film. The polishing slurry includes colloidal silica abrasive, and at least one acid selected from the group consisting of amino acid having a benzene ring and an organic acid having a heterocycle.

U.S. Pat. No. 8,247,328 disclosed a method for CMP of a substrate comprising at least one layer of single crystal silicon carbide. The composition used in the method contains liquid carrier, an abrasive, a catalyst comprising a transition metal composition, and an oxidizing agent.

US 2007/0209287 taught to polish a substrate containing silicon nitride with a polishing composition comprising an abrasive and a nitride accelerator.

US 2009/0215268 disclosed a polishing composition for SiC comprised of an abrasive and an oxidizer mixed in an acidic condition.

JP2012-040671A or WO 2012/026329, described polishing composition for silicon nitride comprised of colloidal silica in which a sulfonic acid, carboxylic acid, or another such organic acid are immobilized.

US2010/0009538 disclosed a polishing composition for silicon nitride having pH of 2.5 to 5.0 comprising colloidal silica and an organic acid that has at least one sulfonic acid group or phosphonic acid group in the molecular structure.

US2008/0200033 disclosed polishing Compound, Method for Polishing Surface to be Polished, and Process for Producing Semiconductor Integrated Circuit Device.

WO 2010/065125 taught Method for Selective polishing of Silicon carbide with respect to silicon dioxide. The method used a composition comprising abrasive, at least one acidic buffering agent, and an aqueous carrier.

US2007/0298612 taughts a method for polishing silicon nitride-containing substrates using a composition comprised of colloidal silica, at least one acidic component with pKa in the range of 1 to about 4.5, and an aqueous carrier.

A semiconductor substrate usually has layers made of different materials, for example, silicon nitride ($Si_3N_4$, or "SiN"), silicon carbide (SiC or "SiC"), silicon oxide ($SiO_2$) dielectric films, and/or "$SiC_xN_y$". In "$SiC_xN_y$" films, x ranges from 0.1 wt % to 55 wt %, y ranges from 0.1 wt % to 32 wt %. When carbon is in low concentration, the "$SiC_xN_y$" films are described as carbon doped "SiN" films; while when nitrogen is in low concentration, "$SiC_xN_y$" films are described as nitrogen doped "SiC" films.

The CMP polishing becomes more challenge, since selectivity is required to remove one material without significantly removing other materials. The development of CMP slurries for polishing $Si_3N_4$, SiC and/or "$SiC_xN_y$" with high removal rates, while being selective to other dielectric materials, such as silicon oxide ($SiO_2$), presents a formidable challenge.

Thus, there remains a need for alternative CMP compositions and methods of polishing semiconductor substrates that can provide reasonable removing rates, as well as selective polishing.

BRIEF SUMMARY OF THE INVENTION

In one aspect, the invention provides a chemical mechanical polishing (CMP) composition comprises:
a) an abrasive;
b) a chemical additive;
c) remaining is substantially liquid carrier;
and optionally;
d) a pH buffering agent;
e) surfactant; and
f) biocide;
and pH of the composition is from about 2.0 to about 8;
wherein the chemical additive is selected from the groups consisting of piperazine derivatives, substituted 4-morpholine derivatives, substituted amino sulfonic acid derivatives and their salts, substituted tertiary amine compounds and their salts, substituted bis-amine compounds and their salts and combinations thereof.

In another aspect, the invention provides a method of chemical mechanical polishing a removal material from a surface of a semiconductor substrate using a chemical mechanical polishing composition comprising steps of:
a) providing a polishing pad;
b) providing a chemical mechanical polishing composition comprising
  1) an abrasive;
  2) a chemical additive;
  3) remaining is substantially liquid carrier;
  and optionally
  4) a pH buffering agent;
  5) surfactant; and
  6) biocide;
  and pH of the composition is from about 2.0 to about 8;
  wherein the chemical additive is selected from the groups consisting of piperazine derivatives, substituted 4-morpholine derivatives, substituted amino sulfonic acid derivatives and their salts, substituted tertiary amine compounds and their salts, substituted bis-amine compounds and their salts and combinations thereof.
c) contacting the surface of the semiconductor substrate with the polishing pad and the chemical mechanical polishing composition; and
d) polishing the surface of the semiconductor substrate;
wherein at least a portion of the surface that containing the removal material is in contact with both the polishing pad and the chemical mechanical polishing composition.

In yet another aspect, the invention provides a method of a selective chemical mechanical polishing comprising steps of:
a) providing a semiconductor substrate having a surface containing a first material and at least one second material;
b) providing a polishing pad;
c) providing a chemical mechanical polishing composition comprising
  1) abrasive;
  2) chemical additive;
  3) remaining is substantially liquid carrier;
  and optionally
  4) a pH buffering agent; and/or
  5) surfactant; and
  6) biocide;
  and pH of the composition is from about 2.0 to about 8;
  wherein the chemical additive is selected from the groups consisting of piperazine derivatives, substituted 4morpholine derivatives, substituted amino sulfonic acid derivatives and their salts, substituted tertiary amine compounds and their salts, substituted bis-amine compounds and their salts and combinations thereof;
d) contacting the surface of the semiconductor substrate with the polishing pad and the chemical mechanical polishing composition; and
e) polishing the surface of the semiconductor substrate to selectively remove the first material;
  wherein at least a portion of the surface containing the first material is in contact with both the polishing pad and the chemical mechanical polishing composition; and ratio of removal rate of the first material to removal rate of the second material is equal or greater than 1.

In all aspects, the piperazine derivatives have the general molecular structure of:

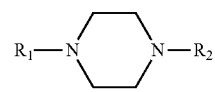

wherein $R_1$ and $R_2$ are independently selected from alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof;

the substituted 4morpholine derivatives have the general molecular structure of:

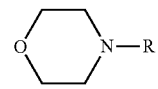

wherein, R is selected from alkyl, alkoxy, substituted organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof;
the organic amino sulfonic acid derivatives and their salts have the general molecular structure of:

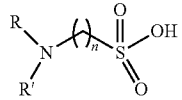

wherein, R and R' are independently selected from the group consisting of, hydrogen, alkyl, cyclohexyl, alkoxy, substituted organic group with one or more hydroxyl groups, substituted organic amide group, substituted organic sulfonic acid, substituted organic sulfonic acid salt, substituted organic carboxylic acid, substituted organic carboxylic acid salt, organic carboxylic ester, organic amine, and combinations thereof; and n equals 1 to 10;
the substituted amine compounds and their salts have the general molecular structure of:

wherein, R, R' and R" are independently selected from the group consisting of, hydrogen, alkyl, cyclohexyl, substituted organic group with one or more hydroxyl groups, substituted organic sulfonic acid, substituted organic sulfonic acid salt, substituted organic carboxylic acid, substituted organic carboxylic acid salt, organic carboxylic ester, substituted organic amide group, and combinations thereof;
the substituted bis-amine compounds and their salts with general molecular structure of:

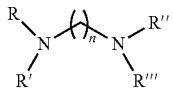

wherein, R, R', R" and R''' are independently selected from the group consisting of, hydrogen, substituted organic group with one or more hydroxyl groups, substituted organic sulfonic acid, substituted organic sulfonic acid salt, substituted organic carboxylic acid, substituted organic carboxylic acid salt, organic carboxylic ester, substituted organic amide group, and combinations thereof; and n equals 1 to 10.

Suitable abrasives include, but are not limited to, alumina, ceria, germania, silica, aluminum-doped silica, titania, zirconia, and mixtures thereof.

DETAILED DESCRIPTION OF THE INVENTION

Figure 1:
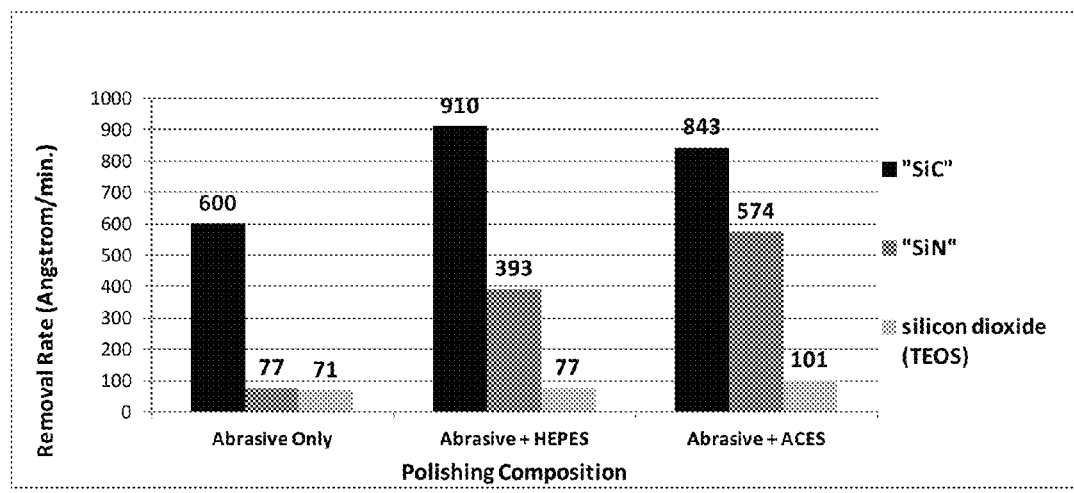
FIG. 1 shows CMP removal rate effect of 4-(2-Hydroxyethyl)piperazine-1-ethanesulfonic acid (HEPES), and N-(2-Acetamido)-2-aminoethanesulfonic acid (ACES) on "SiC", "SiN", and silicon dioxide (TEOS).

Therefore, there is a need to develop a CMP composition that can provide reasonable removal rates in polishing semiconductor substrates. In addition, the CMP composition should also provide suitable removal selectivity among different types of films.

CMP compositions and associated methods described herein are effective for CMP of a wide variety of substrates. The CMP compositions and associated methods are particularly useful for polishing silicon carbide ("SiC") substrates, silicon nitride ("SiN") substrates, or "$SiC_xN_y$" substrates. In "$SiC_xN_y$" films, x ranges from 0.1 wt % to 55 wt %, y ranges from 0.1 wt % to 32 wt %. When carbon is in low concentration, the "$SiC_xN_y$" films are described as carbon doped "SiN" films; while when nitrogen is in low concentration, "$SiC_xN_y$" films are described as nitrogen doped "SiC" films.

Suitable substrates include, but are not limited to, flat panel displays, integrated circuits, memory or rigid disks, metals, interlayer dielectric (ILD) devices, semiconductors, micro-electro-mechanical systems, ferroelectrics, and magnetic heads.

The ratio of the removal rate of one material (the first material) to the removal rate of another material (the second material) is defined as the "selectivity" for the removal of the first material in relation to the second material. For example, the first material can be a silicon carbide film, the second material can be a silicon dioxide film. Then the selectivity for the removal of silicon carbide film to a silicon dioxide film is the ratio of the removal rate of silicon carbide film to the removal rate of silicon dioxide film.

The invention provides CMP polishing compositions containing chemical additives, and methods of using the CMP compositions. The enhanced removal rate and the selectivity of removal are tunable by altering the chemical additives, the pH of the composition, or altering a combination of the two.

The invention provides the following key functions:
enhancing the removal rates while polishing "SiC" films,
providing afforded tunable removal rates while polishing "SiN" films,
maintaining the desirable removal rates while polishing TEOS films,
providing selectivity for the removal of "SiC" in relation to TEOS or "SiN"
providing selectivity for the removal of "SiN" in relation to TEOS.
enhancing the removal rates while polishing "$SiC_xN_y$" films,
providing afforded tunable removal rates while polishing "$SiC_xN_y$" films,
maintaining the desirable removal rates while polishing TEOS films, providing selectivity for the removal of "SiC$_x$N$_y$" in relation to TEOS.

More Specifically, the invention provides a CMP composition comprises:
1. an abrasive;
2. a chemical additive;
3. remaining is substantially liquid carrier;
   and optionally
4. a pH buffering agent; and/or
5. surfactant;
6. biocide;

and pH of the composition is from about 2.0 to about 8;
wherein the chemical additive is selected from the groups consisting of piperazine derivatives, substituted 4-morpholine derivatives, substituted amino sulfonic acid derivatives and their salts, substituted tertiary amine compounds and their salts, substituted bis-amine compounds and their salts and combinations thereof.

The CMP compositions have a pH value that ranges from about 2.0 to about 8.0. In one embodiment, the pH ranges from about 2.0 to 7.5. In another embodiment, the pH ranges from about 3.0 to about 6.5. In yet another embodiment, the pH ranges from about 4.0 to about 5.5. In a further embodiment, the CMP composition has a pH value near 4.0 or near 5.0.

Suitable abrasives for this invention include, but are not limited to, alumina, ceria, germania, silica, aluminum-doped silica, titania, zirconia, and mixtures thereof. In one embodiment, the abrasive is silica such as, for example, colloidal silica or fumed silica. In another embodiment, the abrasive is colloidal silica, the colloidal silica can be made from sodium silicate, or also can be made from tetraethylorthosilicate (TEOS) or tetramethylorthosilicate (TMOS). In yet another embodiment, the abrasive is aluminum-doped colloidal silica.

The particle size in the abrasives ranges from 5 nm to 500 nm, preferably from 10 to 250 nm, and most preferably, from 25 to 100 nm.

The abrasive level in the CMP composition can be ranged from about 0.05 weight % (or wt %) to about 30 weight % of the total weight of the polishing composition. In one particular embodiment, the abrasive level is relatively low and may ranges from about 0.5% to about 5% weight percent of the total weight of the polishing composition. In an alternative embodiment, the abrasive level is about 2% to about 4% weight percent of the total weight of the polishing composition. In a still further embodiment, the abrasive level may be ranged from about 2.5% to about 3.5% weight percent of the total weight of the polishing composition.

The chemical additive in the CMP composition is a removal rate enhancing agent. The CMP compositions comprises about 0.025 weight % to 5 weight %; chemical additive, preferably from 0.15 weight % to 1.5 weight %, and the most preferably from 0.2 weight % to 0.3 weight %.

Considering the Si—C bond is relatively inert towards reaction with the liquid carrier, for example water, the resultant network may be beneficially by interacting with chemical additives that have functional groups resulting in desired chemical and physical properties.

The chemical additive is an organic compound selected from the group consisting of piperazine derivatives, substituted 4-morpholine derivatives, substituted amino sulfonic acid derivatives and their salts, substituted amine compounds and their salts, substituted bis-amine compounds and their salts and combinations thereof.

In one embodiment of the CMP composition described herein, the chemical additive that enhances the removal rates in polishing "SiC" film and/or "SiN" film or "SiC$_x$N$_y$" film comprises piperazine derivatives.

The piperazine derivatives have the general molecular structure depicted below:

wherein, $R_1$ and $R_2$ are independently selected from alkyl, alkoxy, organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof;

Examples of piperazine derivatives include but not limited to 4-(2-Hydroxyethyl)piperazine-1-ethanesulfonic acid (HEPES), 1,4-piperazinediethanesulfonic acid (PIPES), piperazine-1,4-bis(2-hydroxypropanesulfonic acid)dihydrate (POPSO), and 4-(2-Hydroxyethyl)-1-piperazinepropanesulfonic acid (EPPS).

In another embodiment of the CMP composition described herein, the chemical additive that enhances the removal rates of polishing "SiC" and/or "SiN" film or "SiC$_x$N$_y$" film comprises substituted 4-morpholines derivatives.

The substituted 4-morpholine derivatives have the general molecular structure depicted below:

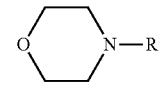

wherein, R is selected from the group consisting of alkoxy, substituted organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof.

Examples of the substituted 4-morpholine derivatives include but not limited to 3-(N-Morpholino)propanesulfonic acid (MOPS), 4-Morpholineethanesulfonic acid (MES), and β-Hydroxy-4-morpholinepropanesulfonic acid (MOPSO).

In yet another embodiment of the CMP composition described herein, the chemical additive that enhance the removal rates in polishing "SiC" and/or "SiN" film or "SiC$_x$N$_y$" film comprises organic amino sulfonic acid derivatives and their salts with general molecular structure of:

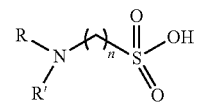

wherein, R and R' are independently selected from the group consisting of hydrogen, alkyl, cyclohexyl, alkoxy, substituted organic group with one or more hydroxyl groups, substituted organic amide group, substituted organic sulfonic acid, substituted organic sulfonic acid salt, substituted organic carboxylic acid, substituted organic carboxylic acid salt, organic carboxylic ester, organic amine, and combinations thereof, and n equals 1 to 10.

The organic amino sulfonic acid derivatives and their salts are primary amine-based organic sulfonic acid molecules when R═R'═hydrogen atoms; secondary amine-based organic sulfonic acid molecules when one of R, R' is a hydrogen connected to the nitrogen atom in the molecules; and tertiary amine-based organic sulfonic acid molecules when both R and R' are not hydrogen atoms.

Examples of the organic amino sulfonic acid derivatives and their salts include but not limited to 2-[(2-Hydroxy-1,1-bis(hydroxymethyl)ethyl)amino]ethanesulfonic acid (TES), N-[Tris(hydroxymethyl)methyl]-3-aminopropanesulfonic acid (TAPS), N-tris(Hydroxymethyl)methyl-4-aminobutanesulfonic acid (TABS), N-(2-Acetamido)-2-aminoethanesulfonic acid (ACES), N,N-Bis(2-hydroxyethyl)-2-aminoethanesulfonic acid (BES), 3-(Cyclohexylamino)-1-propanesulfonic acid (CAPS), 2-(Cyclohexylamino)ethanesulfonic acid (CHES).

In yet another embodiment of the CMP composition described herein, the chemical additive that enhance the removal rates in polishing "SiC" and/or "SiN" film or "$SiC_xN_y$" film comprises substituted amine compounds and their salts with general molecular structure of:

wherein, R, R' and R" are independently selected from the group consisting of, hydrogen, alkyl, cyclohexyl, substituted organic group with one or more hydroxyl groups, substituted organic sulfonic acid, substituted organic sulfonic acid salt, substituted organic carboxylic acid, substituted organic carboxylic acid salt, organic carboxylic ester, substituted organic amide group, and combinations thereof.

Examples of the substituted amine compounds and their salts include but not limited to 2-Hydroxy-3-[tris(hydroxymethyl)methylamino]-1-propanesulfonic acid (TAPSO), N-[Tris(hydroxymethyl)methyl]glycine (TRICINE), N,N-Bis(2-hydroxyethyl)glycine (BICINE), N-(2-Acetamido) iminodiacetic acid (ADA), 2,2-Bis(hydroxymethyl)-2,2',2''-nitrilotriethanol (BIS-TRIS), 3-(Cyclohexylamino)-2-hydroxy-1-propanesulfonic acid (CAPSO), and 3-(N,N-Bis[2-hydroxyethyl]amino)-2-hydroxypropanesulfonic acid (DIPSO).

In yet another embodiment of the CMP composition described herein, the chemical additive that enhance the removal rates in polishing "SiC" film comprises substituted bis-amine compounds and their salts with general molecular structure of:

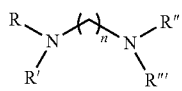

wherein, R, R', R" and R"' are independently selected from the group consisting of, hydrogen, substituted organic group with one or more hydroxyl groups, substituted organic sulfonic acid, substituted organic sulfonic acid salt, substituted organic carboxylic acid, substituted organic carboxylic acid salt, organic carboxylic ester, substituted organic amide group, and combinations thereof; and n equals 1 to 10.

Example of the substituted bis-amine compounds and their salts include but not limited to 1,3-Bis[tris(hydroxymethyl) methylamino]propane (BIS-TRIS PROPANE).

In certain embodiments, the CMP compositions, optionally, comprises about 0.005 weight % to about 5.0 weight % of an oxidizing agent. However, oxidizing agent is not used if the oxidizing agent undesirably reacts with some of the chemical additives.

The oxidizing agent can be any suitable oxidizing agent. Examples of such oxidizing agent include but not limited to: one or more peroxy-compounds comprising at least one peroxy group (—O—O—); oxidized halides including but not limited to chlorates, bromates, iodates, perchlorates, perbromates, periodates, acids thereof, and mixtures thereof; perboric acid; perborates; percarbonates; peroxyacids including but not limited to peracetic acid, perbenzoic acid, m-chloroperbenzoic acid, salts thereof, and mixtures thereof; permanganates; chromates; cerium compounds; ferricyanides including but not limited to potassium ferricyanide; hydrogen peroxide; periodic acid; potassium iodate; potassium permanganate; ammonium persulfate; ammonium molybdate; ferric nitrate; nitric acid; potassium nitrate; and mixtures thereof.

Preferred oxidizing agents include, for example, hydrogen peroxide.

In one particular embodiment, the CMP composition may comprise (hydrogen peroxide) $H_2O_2$ as an alternative oxidizing agent. The concentration of $H_2O_2$ may be ranged from about 0.005 weight % to about 5.0 weight %, from about 0.1 weight % to about 0.25 weight %, or from about 0.15 weight % to about 0.2 weight % of the total weight of the polishing composition.

In certain embodiments, the CMP composition further comprises a pH buffering agent. The pH buffering agent is typically an acid or a base. The pH buffering agent may be used to raise or lower the pH of the CMP composition. And the pH buffering agent may be used, for example, to improve the stability of the polishing composition, improve the safety in handling and use, and/or meet the requirements of various regulations.

Suitable pH buffering agents to lower the pH of the CMP composition include, but are not limited to, hydrochloric acid, nitric acid, sulfuric acid, tartaric acid, succinic acid, citric acid, malic acid, malonic acid, various fatty acids, various polycarboxylic acids, and mixtures thereof.

Suitable pH buffering agents to raise the pH of the CMP composition include, but are not limited to, potassium hydroxide, sodium hydroxide, ammonia, tetramethylammonium hydroxide, and mixtures thereof.

In certain embodiments, the CMP composition further comprises a surfactant. The surfactant is generally used for defect reduction. The surfactant can be anionic, cationic or non-ionic. Examples of a surfactant include but not limited to polyethylene glycol hexadecyl ether, polyethylene glycol dodecyl ether, polyethylene glycol oleyl ether and polyethylene glycol sorbitan monolaurate.

The surfactant ranges about 0.0001 weight % to about 1 weight %.

In certain embodiments, the CMP composition further comprises a biocide. The use of biocide in the enclosed CMP polishing compositions reduces or eliminates bacteria and other microorganisms, especially when the pH values of the CMP polishing compositions is close or around neutral pH conditions.

The biocide ranges from about 0.0001 weight % to about 0.03 weight %.

Examples of a biocide include but not limited to the commercially available Kathon family of biocides, such as, Kathon™, Kathon II, Kathon™ 886 MW Biocide, Kathon 893 MW Biocide, and Kathon CC Biocide.

In certain embodiments, the CMP composition further comprises a polymer. The polymer can be used for different purposes such as viscosity modification, defect reduction or suppression of TEOS removal rate. The polymers can have different molecular weights. Examples of a polymer include but not limited to poly(acrylic acid), poly(ethylene oxide), poly(ethyleneimine), poly(4-vinylpyridine) and poly(vinyl alcohol).

The polymer ranges about 0.0001 weight % to about 0.5 weight %

The rest of composition is liquid carrier. Preferably, the liquid carrier is deionized water.

The invention also provides a method of chemical mechanical polishing a removal material from a surface of a semiconductor substrate using the CMP compositions discloses above.

The method comprises steps of:
e) providing a polishing pad;
f) providing a chemical mechanical polishing composition comprising
  1. abrasive;
  2. chemical additive;
  3. remaining is substantially liquid carrier;
  and optionally
  4. a pH buffering agent;
  5. a surfactant; and
  7) a biocide;
    wherein the chemical additive is selected from the groups consisting of piperazine derivatives, substituted 4-morpholine derivatives, substituted amino sulfonic acid derivatives and their salts, substituted tertiary amine compounds and their salts, substituted bis-amine compounds and their salts and combinations thereof;
g) contacting the surface of the semiconductor substrate with the polishing pad and the chemical mechanical polishing composition; and
h) polishing the surface of the semiconductor substrate;
  wherein at least a portion of the surface that containing the removal material is in contact with both the polishing pad and the chemical mechanical polishing composition.

The invention also provides a method of selective chemical mechanical polishing a material (the first material) in relation of at least another material (the second material) from a surface of a semiconductor substrate using the CMP compositions discloses above.

The method comprises steps of:
a) providing a semiconductor substrate having a surface containing a first material and at least one second material;
b) providing a polishing pad;
c) providing a chemical mechanical polishing composition comprising
  1) abrasive;
  2) chemical additive;
  3) remaining is substantially liquid carrier;
  and optionally
  4) a pH buffering agent;
  5) a surfactant; and
  6) a biocide;
    wherein the chemical additive is selected from the groups consisting of piperazine derivatives, substituted 4-morpholine derivatives, substituted amino sulfonic acid derivatives and their salts, substituted tertiary amine compounds and their salts, substituted bis-amine compounds and their salts and combinations thereof;
d) contacting the surface of the semiconductor substrate with the polishing pad and the chemical mechanical polishing composition; and
e) polishing the surface of the semiconductor substrate to selectively remove the first material;
  wherein at least a portion of the surface containing the first material is in contact with both the polishing pad and the chemical mechanical polishing composition; and ratio of removal rate of the first material to removal rate of the second material is equal or greater than 1.

The CMP compositions have a pH value that ranges from about 2.0 to about 8.0. In one embodiment, the pH ranges from about 2.0 to 7.5. In another embodiment, the pH ranges from about 3.0 to about 6.5. In yet another embodiment, the pH ranges from about 4.0 to about 5.5. In a further embodiment, the CMP composition has a pH value near 4.0 or near 5.0.

Suitable abrasives include, but are not limited to, alumina, ceria, germania, silica, aluminum-doped silica, titania, zirconia, and mixtures thereof. In one embodiment, the abrasive is silica such as, for example, colloidal silica or fumed silica. In another embodiment, the abrasive is colloidal silica, the colloidal silica can be made from sodium silicate, or also can be made from tetraethylorthosilicate (TEOS) or tetramethylorthosilicate (TMOS). In yet another embodiment, the abrasive is aluminum-doped colloidal silica.

Examples of the first material and the second material include but not limited to:
the first material is "SiC" and the second material is $SiO_2$;
the first material is "SiN" and the second material is $SiO_2$;
the first material is "SiC" and the second material is "SiN"; and
the first material is "$SiC_xN_y$"; and the second material is $SiO_2$; wherein x ranges from 0.1 wt % to 55 wt %, y ranges from 0.1 wt % to 32 wt %.

Parameters

Parameters used herein were defined below.
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
psi: pounds per square inch
PS: platen rotational speed of polishing tool, in rpm (revolution(s) per minute) SF:CMP composition flow, ml/min
Removal Rates (RR) and Selectivity
"SiC" RR 2.0 psi Measured removal rate at 2.0 psi down pressure of the CMP tool
"SiN" RR 2.0 psi Measured removal rate at 2.0 psi down pressure of the CMP tool
TEOS RR 2.0 psi Measured removal rate at 2.0 psi down pressure of the CMP tool
Selectivity of "SiC" RR/"SiN" RR or "SiC" RR/TEOS RR at same down force (psi)
Type I Chemical Additive: Piperazine derivatives
Type II Chemical Additive: Substituted 4-Morpholine derivatives Type III Chemical Additive: Organic amino sulfonic acid derivatives and their salts
Type IV Chemical Additive: Substituted amine compounds and their salts
Type V Chemical Additive: Substituted bis-amine compounds and their salts

WORKING EXAMPLE 1

General Procedure

In the working examples presented below, CMP experiments were run using the procedures and under the experimental conditions given below. The CMP tool that was used in the experiments was a Mirra®, manufactured by Applied Materials, 3050 Boweres Avenue, Santa Clara, Calif., 95054. An IC-1010 Polishing pad, supplied by Dow Chemicals, was used on the platen for the blanket wafer polishing studies. Pads were broken-in first by performing pad conditioning break in, followed by polishing dummy oxide (deposited by plasma enhanced CVD from a TEOS precursor, abbreviated as PETEOS) wafers. A Saesol pad conditioning disk, supplied by Saesol Diamond Industries Co., LTD, was used during all pad break-in and polishing procedures.

Polishing experiments were conducted using blanket "SiC" wafer with 800 or 3000 Angstroms in thickness, "SiN" wafer and TEOS wafer. These blanket wafers were purchased from Silicon Valley Microelectronics, 1150 Campbell Ave, CA, 95126.

All percentages are weight percentages unless otherwise indicated.

The structures of some chemical additives were shown in Table 1.

TABLE 1

Structures of Chemical Additive

| Additive Name | Type of Additive* |
|---|---|
| Control | none |
| HEPES | (structure) |
| PIPES | (structure) |
| EPPS | (structure) |
| MOPS | (structure) |

TABLE 1-continued

Structures of Chemical Additive

| Additive Name | Type of Additive* |
|---|---|
| TES | (structure) |
| ACES | (structure) |
| BES | (structure) |
| Tricine | (structure) |
| Bicine | (structure) |

All CMP compositions shown in Table 2 contained 3.0 wt % colloidal silica abrasive, 0.25 wt % chemical additive, and pH of the CMP compositions was about 5.0 CMP composition without chemical additives was used as the baseline and designated as control in Table 2. The down force was 2 psi.

By selecting different types of chemical additives for the CMP compositions, the effect on the removal rate of silicon carbide is shown in Table 2.

TABLE 2

The Chemical Additive Effects on Removal Rates of "SiC" Film

| Additive Name | Type of Additive* | RR of "SiC" Film (Angstrom/min) | "SiC" Removal Rate % Change Compared to Control |
|---|---|---|---|
| Control | none | 600 | control |
| HEPES | Type I | 910 | +52% |
| PIPES | Type I | 863 | +44% |
| EPPS | Type I | 682 | +14% |
| MOPS | Type II | 841 | +40% |
| TES | Type III | 929 | +55% |
| ACES | Type III | 843 | +41% |
| BES | Type III | 965 | +61% |
| Tricine | Type IV | 916 | +53% |
| Bicine | Type IV | 878 | +46% |
| Bis-Tris Propane | Type V | 773 | +29% |

As shown in Table 2, the standard CMP composition that did not contain chemical additives had an averaged "SiC" film polishing removal rate at 600 Angstrom/minute.

When a Type I additive, 4-(2-Hydroxyethyl)piperazine-1-ethanesulfonic acid (HEPES), 1,4-piperazinediethanesulfonic acid (PIPES), or 4-(2-Hydroxyethyl)-1-piperazinepropanesulfonic acid (EPPS), was added to the polishing compositions, the "SiC" film removal rate was increased to 910 Angstrom/minute, 863 Angstrom/minute and 682 Angstrom/minute, respectively. The removal rate increasing represented about 52% removal rate increase when HEPES was used as additive, about 44% removal rate increase when PIPES was used as additive and about 14% when EPPS was used as an additive.

Also as shown in Table 2, when a Type II additive, 4-Morpholinepropanesulfonic acid (MOPS), was added to the polishing compositions, the "SiC" film removal rates was increased to 841 Angstrom/minute. This removal rate increase represented about 40% removal rate increase compared to control when MOPS was used as additive.

Further as shown in Table 2, when a Type III additives, 2-[(2-Hydroxy-1,1-bis(hydroxymethyl)ethyl)amino]ethanesulfonic acid (TES), N-(2-Acetamido)-2-aminoethanesulfonic acid (ACES), or N,N-Bis(2-hydroxyethyl)-2-aminoethanesulfonic acid (BES), was added to the polishing compositions respectively, the "SiC" film removal rate was increased to 929 Angstrom/minute for TES, 843 Angstrom/minute for ACES and 965 Angstrom/minute for BES, respectively. This removal rate increase represented about 55% removal rate increase compared to control when TES was used as additive, about 41% removal rate increase when ACES was used as additive and about 61% removal rate increase when BES was used as additive.

Further as shown in Table 2, when a Type IV additives, N-[Tris(hydroxymethyl)methyl]glycine (TRICINE), or N,N-Bis(2-hydroxyethyl)glycine (BICINE) was added to the polishing compositions respectively, the "SiC" film removal rate was increased to 916 Angstrom/minute for TRICINE and 878 Angstrom/minute for BICINE, respectively. This removal rate increase represented about 53% removal rate increase compared to control when TRICINE was used as additive and about 46% removal rate increase when BICINE was used as additive.

It is apparent from the data presented in Table 2, that the silicon carbide removal rates were enhanced strongly when the CMP composition comprised chemical additives. The removal rates were tunable by alternating the chemical additives used in the composition.

In general, increasing the abrasive concentrations in CMP composition provides an approach to increase the removal rates of "SiC" films in a CMP process. However, increasing abrasive concentrations tends to cause more particle related defects and may cause more mechanical damages to the finished wafer surfaces Thus, CMP polishing compositions having relative low concentrations of abrasives but containing chemical additives provided a better option for enhancing the removal rates of "SiC" films.

In addition to the aforementioned benefits of enhancing "SiC" film removal rates using CMP composition containing chemical additives, tunable selectivity was also achieved while polishing multi-type of films, such as "SiC", "SiN" and silicon dioxide.

The removal rates of "SiC", "SiN" and TEOS films using different additives were listed in Table 3.

TABLE 3

The Chemical Additive Effects on Removal Rates of "SiC", "SiN" and TEOS Films

| Additive Name | Type of Additive* | RR of "SiC" Film (Angstrom/min) | RR of "SiN" Film (Angstrom/min) | RR of TEOS Film (Angstrom/min) |
| --- | --- | --- | --- | --- |
| Control | none | 600 | 77 | 71 |
| HEPES | Type I | 910 | 393 | 77 |
| PIPES | Type I | 863 | 600 | 143 |
| EPPS | Type I | 682 | 338 | 94 |
| MOPS | Type II | 841 | 550 | 76 |
| TES | Type III | 929 | 276 | 73 |
| ACES | Type III | 843 | 574 | 101 |
| BES | Type III | 965 | 594 | 88 |
| Tricine | Type IV | 916 | 191 | 74 |
| Bicine | Type IV | 878 | 109 | 64 |
| Bis-Tris Propane | Type V | 773 | 530 | 187 |

The examples in Table 3 illustrated that the use of chemical additives enhanced the removal rates for all materials tested: "SiC", "SiN" and TEOS films, compared to the absence of chemical additives, i.e. with removal rates higher than the control.

For example, as shown in FIG. 1, the use of HEPES and ACES demonstrated the enhancement of "SiC" and "SiN" removal rates compared to the control. In addition, ACES provided greater "SiN" removal rate enhancement than HEPES compared to the control, showing the enhancement was tunable.

Figure 2:
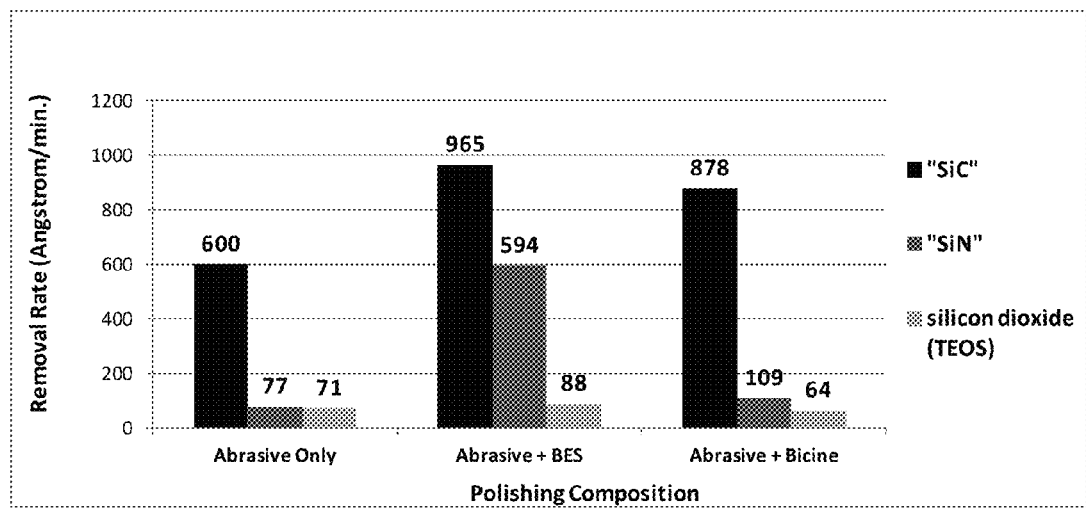
FIG. 2 shows CMP removal rate effect of N,N-Bis(2-hydroxyethyl)-2-aminoethanesulfonic acid (BES) and N,N-Bis (2-hydroxyethyl)glycine (BICINE) on "SiC", "SiN", and silicon dioxide (TEOS).

In another example, as shown in FIG. 2, the use of chemical additives BES and BICINE both led to high "SiC" removal rates. However, the "SiN" removal rate for BES was 594 Angstrom/min, while "SiN" removal rate was 109 Angstrom/min for Bicine. Thus, BES provided much more enhancement for the "SiN" removal, again showing the enhancement was tunable.

The removal selectivities, shown as the ratio of removal rates, of "SiC"/"SiN", "SiC"/TEOS, and "SiN"/TEOS were listed in Table 4.

As shown in Table 4, the removal selectivities were tunable (increased or decreased) depending upon the type of chemical additives been used.

For example, in the cases when HEPES, MOPS, TES, BES, Tricine and Bicine were used, the selectivities of "SiC"/TEOS were higher than the control. Please note that the removal rates for "SiC" were higher than the control (shown in Table 4) for those chemical additives.

TABLE 4

The Chemical Additive Effects on the Selectivity of "SiC", "SiN" and TEOS Films

| Additive Name | Type of Additive* | Selectivity of "SiC"/"SiN" | Selectivity of "SiC"/TEOS | Selectivity of "SiN"/TEOS |
| --- | --- | --- | --- | --- |
| Control | none | 7.8 | 8.5 | 1.1 |
| HEPES | Type I | 2.3 | 11.8 | 5.1 |
| PIPES | Type I | 1.4 | 6.0 | 4.2 |
| EPPS | Type I | 2.0 | 7.3 | 3.6 |
| MOPS | Type II | 1.5 | 11.1 | 7.2 |
| TES | Type III | 3.4 | 12.7 | 3.8 |
| ACES | Type III | 1.5 | 8.3 | 5.7 |
| BES | Type III | 1.6 | 11.0 | 6.8 |
| Tricine | Type IV | 4.8 | 12.4 | 2.6 |
| Bicine | Type IV | 8.1 | 13.7 | 1.7 |
| Bis-Tris Propane | Type V | 1.5 | 4.1 | 2.8 |

In another example, the enhanced "SiC" removal rate for the addition of TES and TRICINE were similar (929 and 916 Angstrom/min respectively, shown in Table 3). The "SiC"/TEOS removal selectivities for the two were also similar (about 12, shown in Table 4). However, the "SiC"/"SiN" removal selectivities were 3.4 and 4.8, respectively.

In another example, additives like BES and BICINE both led to high "SiC" removal rates (FIG. 2) and high "SiC"/TEOS removal selectivities of 11 and 13.7, respectively (Table 4). However, the "SiC"/"SiN" removal selectivity for BES was 1.6 and for BICINE was 8.1, while "SiN"/TEOS removal selectivity for BES was 6.8 and for BICINE was 1.7.

Thus, the removal selectivities in Table 4 demonstrated the tunability of the selective removal of one material versus another, for CMP compositions containing different chemical additives.

In addition, tunable selectivities while polishing multi-type of films, such as "SiC", "SiN" and silicon dioxide can be further achieved by varying the pH of the polishing composition.

WORKING EXAMPLE 2

General Procedure

In the working examples presented below, CMP experiments were run using the procedures and under the experimental conditions given below. The CMP tool that was used in the experiments was a Mirra®, manufactured by Applied Materials, 3050 Boweres Avenue, Santa Clara, Calif., 95054. An Politex polishing pad, supplied by Dow Chemicals, was used on the platen for the blanket wafer polishing studies. Pads were broken-in by polishing dummy oxide (deposited by plasma enhanced CVD from a TEOS precursor, abbreviated as PETEOS) wafers. No conditioning was used on the Politex pad.

Polishing experiments were conducted using blanket "SiN" wafer and TEOS wafer. These blanket wafers were purchased from Silicon Valley Microelectronics, 1150 Campbell Ave, CA, 95126.

All percentages are weight percentages, and data in Tables was a one time data and each number was an average of polishing two wafers, unless otherwise indicated.

All CMP compositions shown in Table 5 contained 3.0 wt % aluminum-doped colloidal silica abrasive, 0.1 wt % chemical additive, and pH of the CMP compositions was about 5.5. The down force was 2 psi. CMP composition without chemical additives was used as the baseline and designated as control in Table 5. By selecting different types of chemical additives for the CMP compositions, the effect on the removal rate of silicon nitride is shown in Table 5.

TABLE 5

The Chemical Additive Effects on Removal Rates of "SiN"

| Additive Name | Type of Additive* | RR of "SiN" Film (Angstrom/min) | "SiN" Removal Rate % Change Compared to Control |
|---|---|---|---|
| Control | none | 145 | control |
| HEPES | Type I | 412 | +184% |
| MOPS | Type II | 460 | +217% |
| BES | Type III | 433 | +199% |
| Tricine | Type IV | 328 | +126% |

As shown in Table 5, the standard CMP composition that did not contain chemical additives had an average "SiN" film polishing removal rate of 145 Angstrom/min.

When a Type I additive, 4-(2-Hydroxyethyl)piperazine-1-ethanesulfonic acid (HEPES), was added to the polishing compositions, the "SiN" film removal rate was increased to 412 Angstrom/minute. The removal rate increasing represented about 184% removal rate increase when HEPES was used as additive.

Also as shown in Table 5, when a Type II additive, 4-Morpholinepropanesulfonic acid (MOPS), was added to the polishing compositions, the "SiN" film removal rate was increased to 460 Angstrom/minute. This removal rate increase represented about 217% removal rate increase compared to control when MOPS was used as additive.

Further as shown in Table 5, when a Type III additives, N,N-Bis(2-hydroxyethyl)-2-aminoethanesulfonic acid (BES), was added to the polishing compositions, the "SiN" film removal rate was increased to 433 Angstrom/minute. This removal rate increase represented about 199% removal rate increase compared to control when BES was used as additive.

Yet, further as shown in Table 5, when a Type IV additives, N-[Tris(hydroxymethyl)methyl]glycine (TRICINE), was added to the polishing compositions respectively, the "SiN" film removal rate was increased to 328 Angstrom/minute. This removal rate increase represented about 126% removal rate increase compared to control when TRICINE was used as additive.

It is apparent from the data presented in Table 5, that the silicon nitride removal rates were enhanced strongly when the CMP composition comprised chemical additives.

Figure 3:
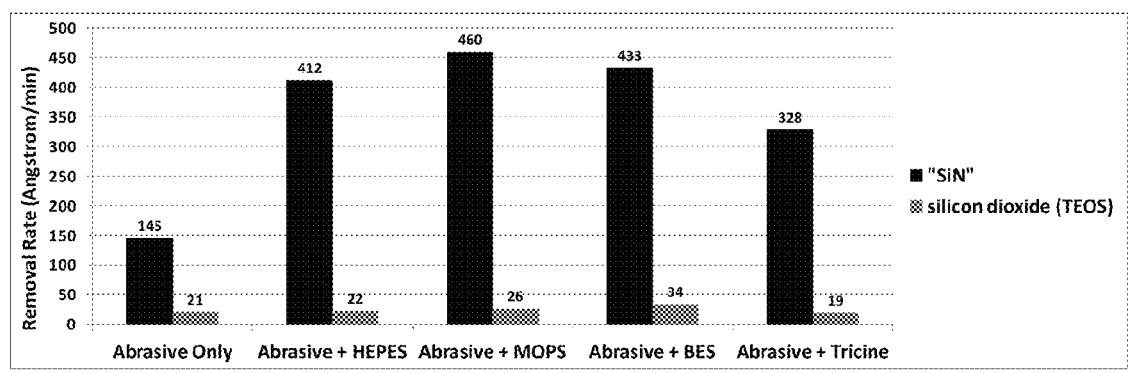
FIG. 3 shows the CMP removal rate of 4-(2-Hydroxyethyl) piperazine-1-ethanesulfonic acid (HEPES), 3-(N-Morpholino)propanesulfonic acid (MOPS), N,N-Bis(2-hydroxyethyl)-2-aminoethanesulfonic acid (BES) and N-[Tris (hydroxymethyl)methyl]glycine (TRICINE) on "SiN" and silicon dioxide (TEOS).

The removal rates were tunable by alternating the chemical additives used in the composition. For example, as shown in FIG. 3, the use of HEPES, MOPS, BES and Tricine demonstrated the enhancement of "SiN" removal rate compared to control. In addition, HEPES, MOPS and BES provided greater "SiN" removal rate enhancement than Tricine compared to the control, showing the enhancement was tunable.

The removal rates of "SiN" and TEOS films and the removal selectivities, shown as the ratio of removal rates of "SiN"/TEOS, using different additives were listed in Table 6.

As shown in Table 6, the removal selectivities were all higher than the control when the chemical additives were used.

TABLE 6

The Chemical Additive Effects on Removal Rates of "SiN"

| Additive Name | Type of Additive* | RR of "SiN" Film (Angstrom/min) | RR of TEOS Film (Angstrom/min) | Selectivity of "SiN"/TEOS |
|---|---|---|---|---|
| Control | none | 145 | 21 | 6.9 |
| HEPES | Type I | 412 | 22 | 18.7 |
| MOPS | Type II | 460 | 26 | 17.7 |
| BES | Type III | 433 | 34 | 12.7 |
| Tricine | Type IV | 328 | 19 | 17.3 |

By selecting different types of chemical additives at two different concentrations in the CMP compositions, the effect on the removal rate of silicon nitride is shown in Table 7.

All CMP compositions shown in Table 7 contained 3.0 wt % aluminum-doped colloidal silica abrasive, 0.025 wt % or 0.25 wt % chemical additive, and pH of the CMP compositions was about 5.5. CMP composition without chemical additives was used as the baseline and designated as control in Table 7. The down force was 2 psi.

TABLE 7

The Chemical Additive Effects on Removal Rates of "SiN"

| Additive Name | Type of Additive* | Additive Concentration (wt %) | RR of "SiN" Film (Angstrom/min) | "SiN" Removal Rate % Change Compared to Control |
|---|---|---|---|---|
| Control | none | none | 67 | control |
| HEPES | Type I | 0.025 | 162 | +142% |
|  |  | 0.25 | 524 | +682% |
| MOPS | Type II | 0.025 | 267 | +299% |
|  |  | 0.25 | 473 | +606% |
| BES | Type III | 0.025 | 249 | +272% |
|  |  | 0.25 | 586 | +775% |
| Tricine | Type IV | 0.025 | 106 | +58% |
|  |  | 0.25 | 365 | +445% |

As shown in Table 7, the standard CMP composition that did not contain chemical additives had an average "SiN" film polishing removal rate of 67 Angstrom/min.

When a Type I additive, 4-(2-Hydroxyethyl)piperazine-1-ethanesulfonic acid (HEPES), was added to the polishing compositions at 0.025 wt % and 0.25 wt %, the "SiN" film removal rate was increased to 162 Angstrom/minute and 524 Angstrom/minute, respectively. The removal rate increasing at the 0.025 wt % and 0.25 wt % concentration levels of the additive represented about 142% and 682% removal rate increase, respectively when HEPES was used as additive. The removal rate increase at 0.25 wt % additive was higher than the removal rate increase at 0.025 wt % additive.

Also as shown in Table 7, when a Type II additive, 4-Morpholinepropanesulfonic acid (MOPS), was added to the polishing compositions at 0.025 wt % and 0.25 wt %, the "SiN" film removal rate was increased to 267 Angstrom/minute and 473 Angstrom/minute, respectively. The removal rate increasing at the 0.025 wt % and 0.25 wt % concentration levels of the additive represented about 299% and 606% removal rate increase, respectively when MOPS was used as additive. The removal rate increase at 0.25 wt % additive was higher than the removal rate increase at 0.025 wt % additive.

Further as shown in Table 7, when a Type III additives, N,N-Bis(2-hydroxyethyl)-2-aminoethanesulfonic acid (BES), was added to the polishing compositions at 0.025 wt % and 0.25 wt %, the "SiN" film removal rate was increased to 249 Angstrom/minute and 586 Angstrom/minute, respectively. The removal rate increasing at the 0.025 wt % and 0.25 wt % concentration levels of the additive represented about 272% and 775% removal rate increase, respectively when BES was used as additive. The removal rate increase at 0.25 wt % additive was higher than the removal rate increase at 0.025 wt % additive.

Yet, further as shown in Table 7, when a Type IV additives, N-[Tris(hydroxymethyl)methyl]glycine (TRICINE), was added to the polishing compositions at 0.025 wt % and 0.25 wt %, the "SiN" film removal rate was increased to 106 Angstrom/minute and 365 Angstrom/minute, respectively. The removal rate increasing at the 0.025 wt % and 0.25 wt % concentration levels of the additive represented about 58% and 445% removal rate increase, respectively when BES was used as additive. The removal rate increase at 0.25 wt % additive was higher than the removal rate increase at 0.025 wt % additive.

It is apparent from the data presented in Table 7, consistent with Table 5, that the silicon nitride removal rates were enhanced strongly when the CMP composition comprised chemical additives.

Figure 4:
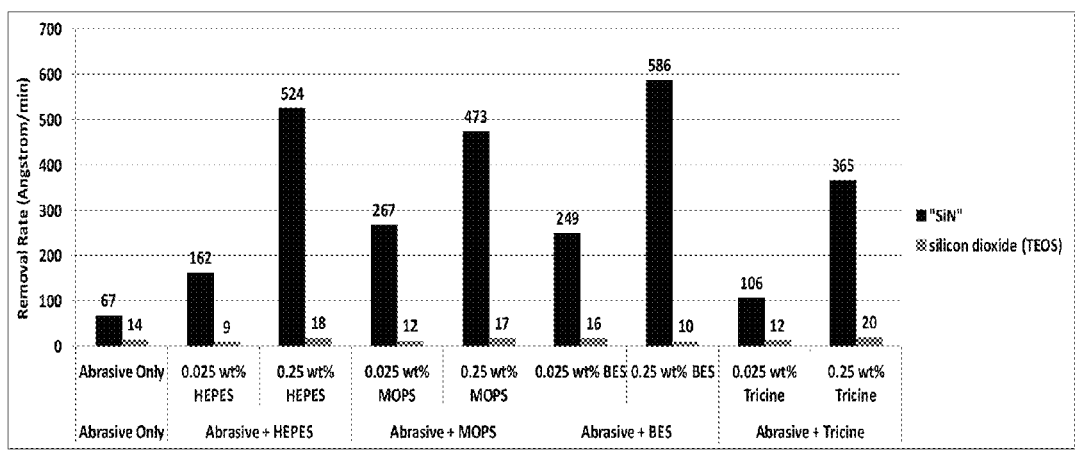
FIG. 4 shows the CMP removal rate effect of 4-(2-Hydroxyethyl)piperazine-1-ethanesulfonic acid (HEPES), 3-(N-Morpholino)propanesulfonic acid (MOPS), N,N-Bis (2-hydroxyethyl)-2-aminoethanesulfonic acid (BES) and N-[Tris(hydroxymethyl)methyl]glycine (TRICINE) at two different additive concentrations on "SiN" and silicon dioxide (TEOS).

The removal rates were tunable by alternating the chemical additives used in the composition. For example, as shown in FIG. 4, the use of HEPES, MOPS, BES and Tricine demonstrated the enhancement of "SiN" removal rate compared to control. In addition, HEPES, MOPS and BES provided greater "SiN" removal rate enhancement than Tricine compared to the control, showing the enhancement was tunable. In addition, the removal rate increase at 0.25 wt % additive was higher than the removal rate increase at 0.025 wt % additive.

The removal rates of "SiN" and TEOS films and the removal selectivities, shown as the ratio of removal rates of "SiN"/TEOS, using different additives at 0.025 wt % or 0.25 wt % were listed in Table 8.

TABLE 8

The Chemical Additive Effects on Removal Rates of "SiN"

| Additive Name | Type of Additive* | Additive Concentration (wt %) | RR of "SiN" Film (Angstrom/min) | "RR of TEOS Film (Angstrom/min) | Selectivity of "SiN"/TEOS |
|---|---|---|---|---|---|
| Control | none | none | 67 | 14 | 4.8 |
| HEPES | Type I | 0.025 | 162 | 9 | 18 |
|  |  | 0.25 | 524 | 18 | 29.1 |
| MOPS | Type II | 0.025 | 267 | 12 | 22.3 |
|  |  | 0.25 | 473 | 17 | 27.8 |
| BES | Type III | 0.025 | 249 | 16 | 15.6 |
|  |  | 0.25 | 586 | 10 | 58.6 |
| Tricine | Type IV | 0.025 | 106 | 12 | 8.8 |
|  |  | 0.25 | 365 | 20 | 18.3 |

As shown in Table 8, the removal selectivities were all higher than the control when the chemical additives were used.

In summary, the CMP compositions containing chemical additives disclosed in the invention had demonstrated enhanced removal rates in polishing semiconductor substrates. The CMP compositions containing chemical additives also provided unexpected high selectivity for "SiC" removal compared to TEOS removal. In addition, The CMP compositions provided tunable selective polishing between "SiC"/"SiN", "SiC"/TEOS, "SiN"/TEOS.

The tunable selective polishing results are expected to be extended to "$SiC_xN_y$"/TEOS.

The working example and embodiments of this invention listed above, are exemplary of numerous embodiments that may be made of this invention. It is contemplated that numerous materials other than those specifically disclosed may be made. Numerous other configurations of the process may also be used, and the materials used in the process

The invention claimed is:

1. A chemical mechanical polishing composition consisting of:
    a) about 0.05 weight % to 30 weight % abrasive;
    b) about 0.025 weight % to about 5 weight % chemical additive;
    c) about 0.0001 weight % to about 0.03 weight % of a biocide;
    d) about 0.0 weight % to about 2.0 weight % of a pH buffering agent;
    e) optionally about 0.0001 weight % to about 1 weight % of a surfactant selected from the group consisting of ethoxylated saturated and unsaturated alcohols; and f) remaining is substantially liquid carrier;
wherein
the pH buffering agent used to lower the pH of the composition is selected from the group consisting of hydrochloric acid, nitric acid, sulfuric acid, tartaric acid, succinic acid, citric acid, malic acid, malonic acid, fatty acid, polycarboxylic acid, and mixtures thereof; and
the pH buffering agent used to raise the pH of the composition is selected from the group consisting of potassium hydroxide, sodium hydroxide, ammonia, and mixtures thereof;
the chemical additive is a substituted 4-morpholine derivative having a general molecular structure of:

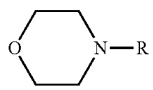

wherein R is selected from the group consisting of alkyl, alkoxy, substituted organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and
pH of the chemical mechanical polishing composition is from about 2.0 to about 8.

2. The composition of claim 1, wherein the chemical additive is the substituted 4-morpholine derivative selected from the group consisting of 3-(N-Morpholino)propanesulfonic acid (MOPS), 4-Morpholineethanesulfonic acid (MES), β-Hydroxy-4-morpholinepropanesulfonic acid (MOPSO), and combinations thereof.

3. The composition of claim 1, wherein the chemical derivative is 3-(N-Morpholino)propanesulfonic acid (MOPS).

4. The composition of claim 1, wherein the abrasive is selected from the group consisting of alumina, ceria, germania, silica, aluminum-doped silica, titania, zirconia, and mixtures thereof; and the liquid carrier is deionized water.

5. The composition of claim 1, wherein the chemical derivative is β-Hydroxy-4-morpholinepropanesulfonic acid (MOPSO).

6. The composition of claim 1, wherein the chemical derivative is 4-Morpholineethanesulfonic acid (MES).

7. A method of a selective chemical mechanical polishing comprising steps of:
a) providing a semiconductor substrate having a surface containing a first material and at least one second material;
b) providing a polishing pad;
c) providing a chemical mechanical polishing composition consisting of:
1) about 0.05 weight % to about 30 weight % abrasive;
2) about 0.025 weight % to 5.0 weight % chemical additive;
3) about 0.0001 weight % to about 0.03 weight % of a biocide;
4) about 0.0 weight % to about 2.0 weight % of a pH buffering agent;
5) optionally about 0.0001 weight % to about 1 weight % of a surfactant selected from the group consisting of ethoxylated saturated and unsaturated alcohols; and
6) remaining is substantially liquid carrier;
wherein the chemical additive is a substituted 4-morpholine derivative having a general molecular structure of:

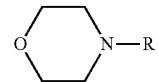

wherein R is selected from the group consisting of alkyl, alkoxy, substituted organic group with one or more hydroxyl groups, substituted organic sulfonic acid, substituted organic sulfonic acid salt, substituted organic carboxylic acid, substituted organic carboxylic acid salt, organic carboxylic ester, organic amine, and combinations thereof; and
pH of the chemical mechanical polishing composition is from about 2.0 to about 8;
d) contacting the surface of the semiconductor substrate with the polishing pad and the chemical mechanical polishing composition; and
e) polishing the surface of the semiconductor substrate to selectively remove the first material;
wherein at least a portion of the surface containing the first material is in contact with both the polishing pad and the chemical mechanical polishing composition;
ratio of removal rate of the first material to removal rate of the second material is equal to or greater than 1.

8. The method of claim 7, wherein the substituted 4-morpholine derivative is selected from the group consisting of 3-(N-Morpholino)propanesulfonic acid (MOPS), 4-Morpholineethanesulfonic acid MES), and combinations thereof.

9. The method of claim 7, wherein the chemical derivative is 3-(N-Morpholino)propanesulfonic acid (MOPS).

10. The method of claim 7, wherein the abrasive is selected from the group consisting of alumina, ceria, germania, silica, aluminum-doped silica, titania, zirconia, and mixtures thereof; and the liquid carrier is deionized water.

11. The method of claim 7, wherein
the first material is "$SiC_xN_y$"; and
the second material is selected from the group consisting of $SiO_2$ and "SiN";
wherein x ranges from 0.0 wt % to 55 wt %, y ranges from 0.0 wt % to 32 wt %; x and y are not 0 at the same time and
the first material and the second material are different materials.

12. The method of claim 7, wherein
the first material is "SiC" and the second material is $SiO_2$ or "SiN"; or
the first material is "SiN" and the second material is $SiO_2$.

* * * * *